United States Patent
Zhang

(10) Patent No.: US 8,549,165 B2
(45) Date of Patent: Oct. 1, 2013

(54) PROCESSING DEVICES AND METHODS FOR TRANSMITTING AND RECEIVING DATA

(75) Inventor: Mingyuan Zhang, Qingdao (CN)

(73) Assignee: Hisense Hiview Tech Co., Ltd., Qingdao, Shandong (CN)

( * ) Notice: Subject to any disclaimer, the term of this patent is extended or adjusted under 35 U.S.C. 154(b) by 0 days.

(21) Appl. No.: 13/577,679

(22) PCT Filed: Jul. 27, 2010

(86) PCT No.: PCT/CN2010/075487
§ 371 (c)(1),
(2), (4) Date: Aug. 8, 2012

(87) PCT Pub. No.: WO2012/012933
PCT Pub. Date: Feb. 2, 2012

(65) Prior Publication Data
US 2012/0311084 A1    Dec. 6, 2012

(51) Int. Cl.
*G06F 15/16* (2006.01)

(52) U.S. Cl.
USPC ............ 709/231; 709/201; 709/203; 709/245

(58) Field of Classification Search
USPC .................................. 709/201, 203, 231, 245
See application file for complete search history.

(56) References Cited

U.S. PATENT DOCUMENTS

| | | | | |
|---|---|---|---|---|
| 7,203,753 B2 * | 4/2007 | Yeager et al. | | 709/225 |
| 2003/0061287 A1 * | 3/2003 | Yu et al. | | 709/205 |
| 2004/0030743 A1 * | 2/2004 | Hugly et al. | | 709/203 |
| 2004/0158546 A1 | 8/2004 | Sobel et al. | | |
| 2005/0021935 A1 * | 1/2005 | Schillings et al. | | 713/1 |
| 2010/0175099 A1 | 7/2010 | Kim et al. | | |
| 2010/0178031 A1 | 7/2010 | Kim et al. | | |

FOREIGN PATENT DOCUMENTS

| | | |
|---|---|---|
| CN | 1388722 A | 1/2003 |
| CN | 1241437 C | 2/2006 |
| CN | 1859204 A | 11/2006 |
| WO | WO 2010/077123 A2 | 7/2010 |

OTHER PUBLICATIONS

International Search Report (PCT/ISA/210) issued on Apr. 28, 2011, by the Chinese Patent Office as the International Searching Authority for International Application No. PCT/CN2010/075487.

Written Opinion (PCT/ISA/237) issued on Apr. 28, 2011, by the Chinese Patent Office as the International Searching Authority for International Application No. PCT/CN2010/075487.

* cited by examiner

*Primary Examiner* — Liangche A Wang
(74) *Attorney, Agent, or Firm* — Buchanan Ingersoll & Rooney PC

(57) ABSTRACT

Processing devices and methods for transmitting and receiving data are provided. By performing multiple checks on the downloaded control data packets and the decompressed control data, the data status of each process can be known during the processes from the data packets downloading to decompression. And the correct processing can be performed, thus avoiding loading and running failure caused by incomplete data.

20 Claims, 4 Drawing Sheets

PROCESSING DEVICES AND METHODS FOR TRANSMITTING AND RECEIVING DATA

FIELD OF THE INVENTION

The present invention relates to the field of Internet television (Internet TV) technology, and particularly to processing devices for transmitting and received data and methods thereof.

BACKGROUND OF THE INVENTION

With the development in networking technologies, various Internet functions have been developed. Meanwhile, many of those Internet functions are provided with a new level of intelligence. As one of the important forms of intelligence, resource sharing includes: uploading resources to a server; and downloading a resource of interest by a client from the server, and then running the resource on the client. For example, for an Internet TV client, the user may often need to install certain controls in order to achieve corresponding functions; this generally includes downloading a control data package from a server to the client, and executing it on the client.

In the prior art, when a control has been developed, the control data is directly packaged and then uploaded to a server; the client directly downloads the control data from the server, and executes it after decompressing the data package.

In their studies, the inventors of the present invention found that there is at least the following problem associated with the prior art: in the process of acquiring control data from a server, incompleteness of downloaded data and incompleteness of decompressed data often occur, both of which may cause the acquired control data to be unable to work normally.

SUMMARY OF THE INVENTION

The object of an embodiment of the present invention is to provide processing devices for transmitting and received data and methods thereof, which can avoid loading failures and execution failures caused by data incompleteness.

According to a aspect of the present invention, a processing device for transmitting data is provided, including:

a first check-code generating unit, adapted to generate a first check-code by applying a first check algorithm to all control data of a control, and store the first check-code into a first record file;

a compression unit, adapted to compress the first record file together with all control data files of the control, to obtain a control data package;

an uploading unit, adapted to upload the control data package to a server;

a second check-code generating unit, adapted to provide on the server side a download address for the control data package, and generate a second check-code by applying a second check algorithm to the control data package; and an information providing unit, adapted to provide, when the server side receives an access request from a client, the download address and the second check-code to the client through an XML file, so that the client downloads the control data package by using the download address, verifies the integrity of the control data package by using the second check-code, and verifies the integrity of the control data files obtained from decompression by using the first check-code.

According to another aspect of the present invention, a processing method for transmitting data is provided, including:

generating a first check-code by applying a first check algorithm to all control data of a control, and storing the first check-code into a first record file;

compressing the first record file together with all control data files of the control, to obtain a control data package;

uploading the control data package to a server;

providing on the server side a download address for the control data package, and generating a second check-code by applying a second check algorithm to the control data package; and providing, when the server side receives an access request from a client, the download address and the second check-code to the client through an XML file, so that the client downloads the control data package by using the download address, verifies the integrity of the control data package by using the second check-code, and verifies the integrity of the control data files obtained from decompression by using the first check-code.

According to another aspect of the present invention, a processing device for receiving data is provided, including:

an analyzing unit, adapted to analyze an XML file provided by a server, to acquire a download address for a control data package and a second check-code generated by the server side applying a second check algorithm to the control data package, with the control data package including a first record file and all control data files of a control, and the first record file storing a first check-code generated by applying a first check algorithm to all control data of the control;

a downloading unit, adapted to download the control data package from the server by using the download address;

a third check-code generating unit, adapted to generate a third check-code by applying the second check algorithm to the downloaded control data package;

a first verification unit, adapted to compare whether the third check-code is the same as the second check-code, so as to verify the integrity of the downloaded control data package;

a decompression unit, adapted to decompress, if the third check-code is the same as the second check-code, the downloaded control data package, to obtain the control data files of the control and the first record file;

a fourth check-code generating unit, adapted to generate a fourth check-code check by applying the first check algorithm to all the control data obtained from the decompression; and a second verification unit, adapted to compare whether the fourth check-code is the same as the first check-code, so as to verify the integrity of the control data files obtained from the decompression.

According to another aspect of the present invention, a processing method for receiving data is provided, including:

analyzing an XML file provided by a server, to acquire a download address for a control data package and a second check-code generated by the server side applying a second check algorithm to the control data package, with the control data package including a first record file and all control data files of a control, and the first record file storing a first check-code generated by applying a first check algorithm to all control data of the control;

downloading the control data package from the server by using the download address;

generating a third check-code by applying the second check algorithm to the downloaded control data package;

comparing whether the third check-code is the same as the second check-code, so as to verify the integrity of the downloaded control data package;

if the third check-code is the same as the second check-code, decompressing the downloaded control data package, to obtain the control data files of the control and the first record file;

generating a fourth check-code check by applying the first check algorithm to all the control data obtained from the decompression; and comparing whether the fourth check-code is the same as the first check-code, so as to verify the integrity of the control data files obtained from the decompression.

The technical solutions provided by the embodiments of the present invention may bring the following advantageous effects.

According to the data processing devices and methods provided by the embodiments of the present invention, multiple checks are performed on the downloaded control data package and the control data obtained from decompression, to achieve data integrity check; as a result, data status in each of the processes from data package downloading to decompression can be learned, which enables proper handling and avoids loading failures and execution failures caused by data incompleteness.

BRIEF DESCRIPTION OF THE DRAWINGS

For a better understanding of the technical solutions in the embodiments of the present invention and in the prior art, accompanying drawings used in the description are briefly described below. Clearly, these drawings are merely some embodiments of the present invention, and those skilled in the art can obtain other drawings from these drawings without inventive effort.

DETAILED DESCRIPTION OF THE EMBODIMENTS

Figure 1:
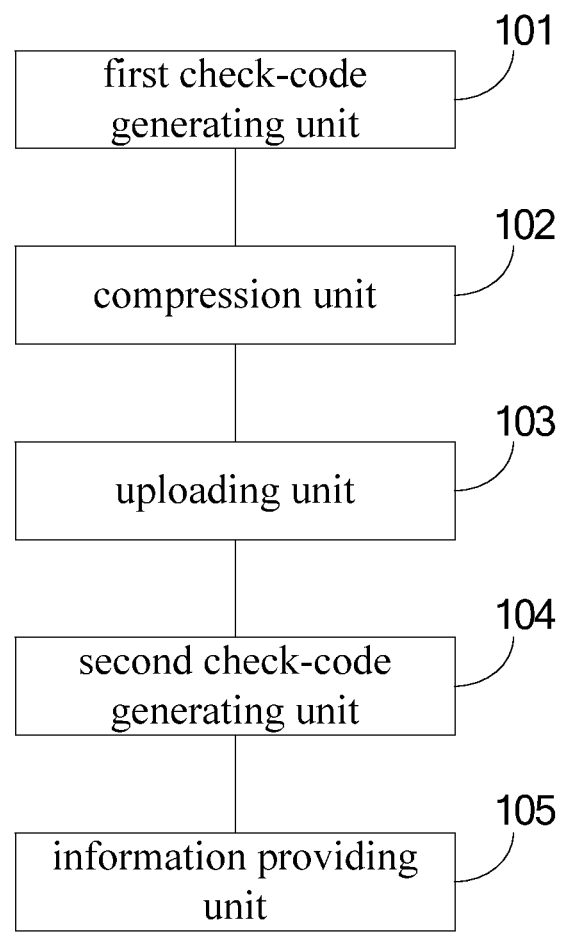
FIG. 1 is a schematic diagram illustrating a processing device for transmitting data according to an embodiment of the present invention.

The objects, technical solutions and advantages of the present invention will become clearer from the following description in conjunction with the accompanying drawings and embodiments. It is noted that the specific embodiments described herein are merely for illustrative purposes, and shall not be considered as limiting the present invention.

First Embodiment

According to the first embodiment of the invention, a processing device for transmitting data includes:

a first check-code generating unit, adapted to generate a first check-code by applying a first check algorithm to all control data of a control, and store the first check-code into a first record file;

a compression unit, adapted to compress the first record file together with all control data files of the control, to obtain a control data package;

an uploading unit, adapted to upload the control data package to a server, that is, before uploading the control data package to the server, a first round of check is performed on the control data, thereby generating a first check-code, the first check-code being used on the receiving side to verify the integrity of the control data, specifically, whether the integrity is compromised in the process of decompressing the data package;

a second check-code generating unit, adapted to provide on the server side a download address for the control data package, and generate a second check-code by applying a second check algorithm to the control data package, after uploading the control data package to the server, a second round of check is performed on the control data package, thereby generating a second check-code, the second check-code being used on the receiving side to verify the integrity of the control data package, specifically, whether the integrity of the data package is compromised in the process of network transmission;

an information providing unit, adapted to provide, when the server side receives an access request from a client, the download address and the second check-code to the client through an XML file, so that the client downloads the control data package by using the download address, verifies the integrity of the control data package by using the second check-code, and verifies the integrity of the control data files obtained from decompression by using the first check-code.

Specifically, the information providing unit may further be adapted to provide, when the server side receives the access request from the client, the size of the control data package to the client through the XML file, so that the client verifies the integrity of the control data package by using the size of the control data package.

Or, the information providing unit may also be adapted to provide, when the server side receives the access request from the client, name and version information of the control to the client through an XML file, so that the client determines according to the name and version information whether to download the control data package.

The device may further include: a file name and version information storing unit, adapted to store name and version information of the control data files of the control into a second record file. Specifically, the compression unit is adapted to compress the first record file and the second record file together with the control data files, to obtain a control data package, so that after correctly downloading and decompressing the control data package to the client, the client adds a new control data file into a local control data folder for the control or replaces an old-version control data file according to the name and version information of the control data files.

The device may further include: a storage path information storing unit, adapted to store storage paths of the control data files on the client into the second record file, so that the client stores the control data files obtained from decompression according to the storage paths.

Second Embodiment

According to the second embodiment of the invention, a processing device for receiving data is provided, including:

an analyzing unit, adapted to analyze an XML file provided by a server, to acquire a download address for a control data package and a second check-code generated by the server side applying a second check algorithm to the control data package, with the control data package including a first record file and all control data files of a control, and the first record file storing a first check-code generated by applying a first check algorithm to all control data of the control;

a downloading unit, adapted to download the control data package from the server by using the download address;

a third check-code generating unit, adapted to generate a third check-code by applying the second check algorithm to the downloaded control data package;

a first verification unit, adapted to compare whether the third check-code is the same as the second check-code, so as to verify the integrity of the downloaded control data package;

a decompression unit, adapted to decompress, if the third check-code is the same as the second check-code, the downloaded control data package, to obtain the control data files of the control and the first record file;

a fourth check-code generating unit, adapted to generate a fourth check-code check by applying the first check algorithm to all the control data obtained from the decompression; and a second verification unit, adapted to compare whether the fourth check-code is the same as the first check-code, so as to verify the integrity of the control data files obtained from the decompression.

Specifically, the analyzing unit may further be adapted to acquire a control data package size provided by the server through the XML file.

The device may further include:

a third verification unit, adapted to compare whether the size of the downloaded control data package equals to the control data package size acquired from the XML file; and if so, trigger the third check-code generating unit to perform the third check-code generating step.

The analyzing unit may further be adapted to acquire control name and version information provided by the server through an XML file.

In addition, the device may further include:

a determination unit, adapted to compare local control name and version information on the client with the control name and version information acquired from the XML file; and in the event where the control names are different or where the control names are the same but the version information are different, trigger the downloading unit to perform the downloading step.

As a preferred implementation, the control data package may also include a second record file for storing name and version information of the control data files of the control. Accordingly, the device may further include:

a control data file processing unit, adapted to, if the fourth check-code is the same as the first check-code, add a new control data file into a local control data folder for the control on the client or replace an old-version data file according to the name and version information of the control data files.

Specifically, the second record file may also be used for storing storage paths of the control data files on the client. Then the device may further include:

a control data file processing unit, adapted to store, if the fourth check-code is the same as the first check-code, the control data files obtained from decompression according to the storage paths.

In practice, the technical solution provided by the embodiment of the invention may be applied to the client-server model. In such a network system, generally, controls are developed on a development platform, then the control data is released to a server; a user views a list of controls provided by the server through a network connection, downloads control data of interest, and installs the corresponding control to a local machine. The embodiment of the invention relate to a systematic solution to the processing of the control data before and after it is uploaded to the server as well as when the user downloads the control. For a better understanding of the technical solution provided by the embodiment of the invention, a specific implementation in the application scenario above will be described in detail hereinafter.

Third Embodiment

According to the third embodiment of the invention, a processing device for transmitting data is provided for the processing of the control data of a newly developed control before and after it is uploaded to a server. As shown in FIG. 1, the device includes the following units.

A first check-code generating unit 101 is adapted to generate a first check-code by applying a first check algorithm to all control data of the control, and store the first check-code into a first record file.

Specifically, control data refers to any file required for installation and execution of a control. Every newly developed control has control data, and the client installs or executes the control according to the control data.

Generally, for a control, the control data includes multiple files, which are stored in a folder. In the prior art, the control data files are directly packaged into a control data package, which is uploaded to a server. However, according to the embodiment of the invention, before packaging the control data files of a control, a check algorithm is applied to all the control data files to generate a check code; the check code is stored into a record file. Specifically, the check algorithm may include CRC32, MD5, Block Check Character (BCC), etc. For example, in the embodiment of the invention, CRC32 is applied to all the control data of a control to generate a check code for the control. Moreover, the check code is unique, i.e., different check-codes will be generated for different controls.

A compression unit 102 is adapted to compress the first record file together with the control data files, to obtain a control data package.

In data compression, the first record file where the check code is stored and the control data files are compressed (packaged) together, to generate a control data package. Specifically, the standard compression command tar in Linux may be used; as a matter of course, other compression standards may also be used.

An uploading unit 103 is adapted to upload the control data package to a server.

When the control data package has been generated, it may be uploaded to a server via an uploading interface of the server.

A second check-code generating unit 104 is adapted to provide on the server side a download address for the control data package, and generate a second check-code by applying a second check algorithm to the control data package.

After the control data package is uploaded to the server, a download address for the control data package may be provided on the server side, so that the download address is provided to the client, and the client downloads the control data according to the download address.

In addition, a second round of check is performed on the control data package on the server side, thereby generating a check code for the control data package. It is noted, in order to distinguish the check-codes, the one generated from the control data files before packaging is referred to as the first check-code, and the corresponding check algorithm is referred to as the first check algorithm; while the one generated from the control data package on the server side is referred to as the second check-code, and the corresponding check algorithm is referred to as the second check algorithm. The first check algorithm and the second check algorithm may be the same or different.

Therefore, in the embodiment of the invention, two levels of check are performed on the control data, the first level being for the control data itself and generating a first check-code, while the second level being for the control data package and generating a second check-code.

Specifically, the first check-code is in the control data package, and can be downloaded along with the control data package by the user to the client. The download address and the second check-code for the control data package are generated on the server side, they can be stored in an XML (Extensible Markup Language) file that is formed by HTTP (Hypertext Transfer Protocol) on the serve side.

An information providing unit 105 is adapted to provide, when the server side receives an access request from a client, the download address and the second check-code to the client through an XML file, so that the client downloads the control data package by using the download address, verifies the integrity of the control data package by using the second check-code, and verifies the integrity of the control data files obtained from decompression by using the first check-code.

Since the XML file is generated on the server side, when the client accesses the server, the download address and the second check-code for the control data package stored in the XML file can be provided to the client through the XML file. It is noted, multiple control data packages may be uploaded to the server, each of which corresponds to a different function, hence, respective download addresses and second check-codes for the multiple control data packages may be provided through one XML file. The client may select a control data package to be downloaded as needed, acquire the corresponding download address, and download the control data package from the server.

When the control data package has been downloaded to the client, the client may verify data integrity by using the first check-code and the second check-code. Specifically, after downloading the control data package, the client may apply a check algorithm the same as the one used by the server side on the control data package (i.e., the second check algorithm) to the downloaded control data package, to generate a third check-code. Then, the client may compare the third check-code with the second check-code. If the two check-codes are the same, it is determined that the control data package is complete, i.e., its integrity is not compromised in the process of network transmission.

It is noted, in a preferred embodiment of the invention, the server side may also provide the size of the control data package to the client through the XML file. Hence, before generating the third check-code from the downloaded control data package, the client may acquire the size of the downloaded control data package, and compare it with the control data package size analyzed from the XML file. If they do not equal, it is determined that the control data package is not complete; therefore there is no need for the third check-code generating operation and the subsequent comparison operation. Otherwise, i.e., if they equal, the third check-code generating operation and the subsequent comparison operation are performed. Therefore, two levels of verification are performed on the downloaded control data package by the client, thus ensuring the integrity of the control data package.

That is, the information providing unit 105 may further be adapted to provide, when the server side receives the access request from the client, the size of the control data package to the client through the XML file, so that the client verifies the integrity of the control data package by using the size of the control data package.

Only when the client learns the control data package is complete, it decompresses the control data package into the control data files and the first record file. Specifically, the decompression operation corresponds to the compression operation before. For example, if a compressing tar command in Linux is used in compression, a corresponding decompressing tar command in Linux is used in decompression of the control data package. Then, the client may apply a check algorithm to all the control data files obtained by decompressing the control data package, to generate a fourth check-code. Specifically, the check algorithm used is the same as the one used by the first check-code generating unit 101 (i.e., the first check algorithm). Moreover, the first check-code is extracted from the first record file obtained from decompression, and the first check-code and the fourth check-code are compared. If the two check-codes are the same, it is determined that the control data files are complete, and data integrity is not compromised in the process of decompression. Then, the control data files may be stored to specified paths.

It is noted, in a preferred embodiment of the invention, before generating the fourth check-code from the control data files obtained from decompression, the client may check whether there exists a first record file in the files obtained from decompression. If there is no first record file, it is determined that the data is incomplete; therefore there is no need for the fourth check-code generating operation, and error handling can be performed directly. If there is a first record file, the fourth check-code generating operation and the subsequent comparison operation are performed. Therefore, two levels of verification are performed on the decompressed data by the client.

On the contrary, if the third check-code is different from the second check-code, it is determined that the integrity of the control data package is compromised in the process of network transmission, and the data package cannot work normally for installation or execution. Consequently, corresponding error handling may be performed. Specifically, the error handling may include: deleting the control data package, marking the control data package as "damaged" to instruct the system not to decompress it, prompting that the file is damaged in the process of downloading to indicate the reason for the error, etc. Similarly, if the third check-code is the same as the second check-code, but the fourth check-code is different from the first check-code, it is determined that data integrity is compromised in the process of decompression, and such data cannot work normally for installation or execution. Therefore, corresponding error handling may also be performed. Specifically, the error handling may include: deleting the control data files obtained from decompression, marking them as "damaged", marking them as "damaged in the process of decompression", etc. In the last case, the downloaded control data package is complete, and the integrity is compromised in the process of decompression; therefore, decompression may be performed on the control data package again, and the integrity of the control data files obtained from the decompression may be determined, without the need for re-downloading the control data package from the server.

In practice, only when the client does not have a control, or when the client has the control but needs an updated version on the server side, the client downloads the control data package from the server and installs it. That is, when the client already has the functionality of a control and there is no new version on the server side, there is no need to download the corresponding control data package.

Therefore, in order to avoid unnecessary downloading operations, before downloading a control data package, the client may determine whether to download it. Then, the information providing unit 105 according to the embodiment of the invention may further be adapted to:

provide, when the server side receives the access request from the client, name and version information of the control to the client through an XML file, so that the client determines according to the name and version information whether to download the control data package.

It is noted, the name and version information of a control is related to the control as a whole, without specifying name and version information of a particular control data file. In other words, since a control generally corresponds to a function, the name and version information of a control corresponds to the name and version information of the function.

Specifically, control name and version information corresponding to control data packages can be manually added to an XML file generated on the server side. Therefore, when the server receives an access request from the client, the name and version information of a control can be provided to the client along with the download address and the second checkcode for the control data package through the XML file.

When accessing the server, the client may analyze the XML file provided by the server to acquire the name and version information of a control to be downloaded. Then, the client determines whether there is a local control having the same name as the control to be downloaded. If not, the control data package to be downloaded is downloaded according to the download address; if so, the version of the local control is compared with the version information of the control to be downloaded. If the versions are different, it is determined that there is a new version of the control on the server, and a downloading operation may be performed according to the download address for the control data package to be downloaded; otherwise, no downloading operation is performed.

Moreover, before packaging the control data files, in addition to storing a check code corresponding to the control into the record file, the name and version information of the control data files of a control may be stored into a second record file, which is also compressed into the control data package.

It is noted, the name and version information of control data files are different from the control name and version information provided to the client by the server through an XML file. As described above, a control may have multiple control data files, which form a folder; and the name and version information of control data files refer to the names and versions of the files in the folder.

Furthermore, it is noted, the update of a control may only affect some of the control data files, i.e., the other control data files remain unchanged. Therefore, each control data file has version information; in updating a local control of the client from an old version, only some of the control data files that are updated need to be replaced, while the other control data files do not need to be replaced. In an embodiment of the invention, the name and version information of control data files may be stored into a second record file, facilitating control data file replacement by the client.

Therefore, after decompressing the control data package, the client acquires the name and version information of control data files stored in the second record file, compares them with the names and versions of local control data files of the control, determines whether the control data files are to be updated, and performs corresponding operations. Then the processing device for transmitting data provided in the third embodiment of the invention may further include:

a file name and version information storing unit, adapted to store name and version information of the control data files of the control into a second record file. Specifically, the compression unit 102 is adapted to compress the first record file and the second record file together with the control data files, to obtain a control data package, so that after correctly downloading and decompressing the control data package to the client, the client adds a new control data file into a local control data folder for the control or replaces an old-version control data file according to the name and version information of the control data files.

In practice, unlike common computers where the storage path of a file can be freely determined by the user, an Internet TV client generally stores a downloaded file to a default path which cannot be changed; therefore, updating or adding of a control can only be done to a default path on the client. In order to facilitate changing the storage path of a downloaded file, the processing device for transmitting data provided by the embodiment of the invention may further include:

a storage path information storing unit, adapted to store storage paths of the control data files on the client into the second record file, so that the client stores the control data files obtained from decompression according to the storage paths.

Specifically, before data packaging, the storage paths of the control data files obtained from decompression on the client are configured, and then stored into a record file. The record file is compressed into the control data package along with the control data files. When the client obtains the control data files from decompression, it can also obtain storage path information from the second record file, and store the control data files according to the path information.

Specifically, the second record file, in the case where file names, version information and storage paths are stored, may have a specific storage format shown in Table 1. Two files are assumed: AP.elf and RES.bin, both of which have a version number of 0.0.1, and their storage path is the system folder chakra (in a Linux system or a file system).

TABLE 1

| name | colon | VFN | dot | VSN | dot | VTN | dot | colon | path | colon | ln |
|---|---|---|---|---|---|---|---|---|---|---|---|
| AP.elf | : | 0 | . | 0 | . | 1 | . | : | /chakra | : | \n |
| RES.bin | : | 0 | . | 0 | . | 1 | . | : | /chakra | : | \n |

In Table 1, name represents the name of a file to be packaged; colon ":" represents a separator from the subsequent content; VFN dot VSN dot VTN represents the version number of the file, e.g., 0.0.1 as shown in the table; Dot "." represents the end of the version number; Path represents the path in the file system to which the file is stored; and Ln "\n" represents a terminator.

It is noted, in the case where the second record file is compressed into the control data package, the verification by the client of the integrity of the control data files obtained from decompression may include: checking whether there exist a first record file and a second record file, if either one of them does not exist, determining loss of data, i.e., incompleteness of data, and performing error handing directly without the fourth check-code generating operation and subsequent operations; if both record files exist, reading a file list from the second record file, and comparing them with the files in the control data folder obtained from decompression, if the files are not complete, determining loss of data and performing error handling directly without the fourth check-code generating operation and subsequent operations; if the files are complete, performing the fourth check-code generation operation and the subsequent comparison operation. Therefore, three levels of verification are performed by the client on the data obtained from decompression, ensuring the integrity of the data obtained from decompression.

The processing device for transmitting data provided by the third embodiment of the invention is described above in detail, which achieves data integrity check by multiple checks on the data, as a result, data status in each of the processes from data package downloading to decompression can be learned, thereby enabling proper handling and avoiding loading failures and execution failures caused by data incompleteness.

Fourth Embodiment

Figure 2:
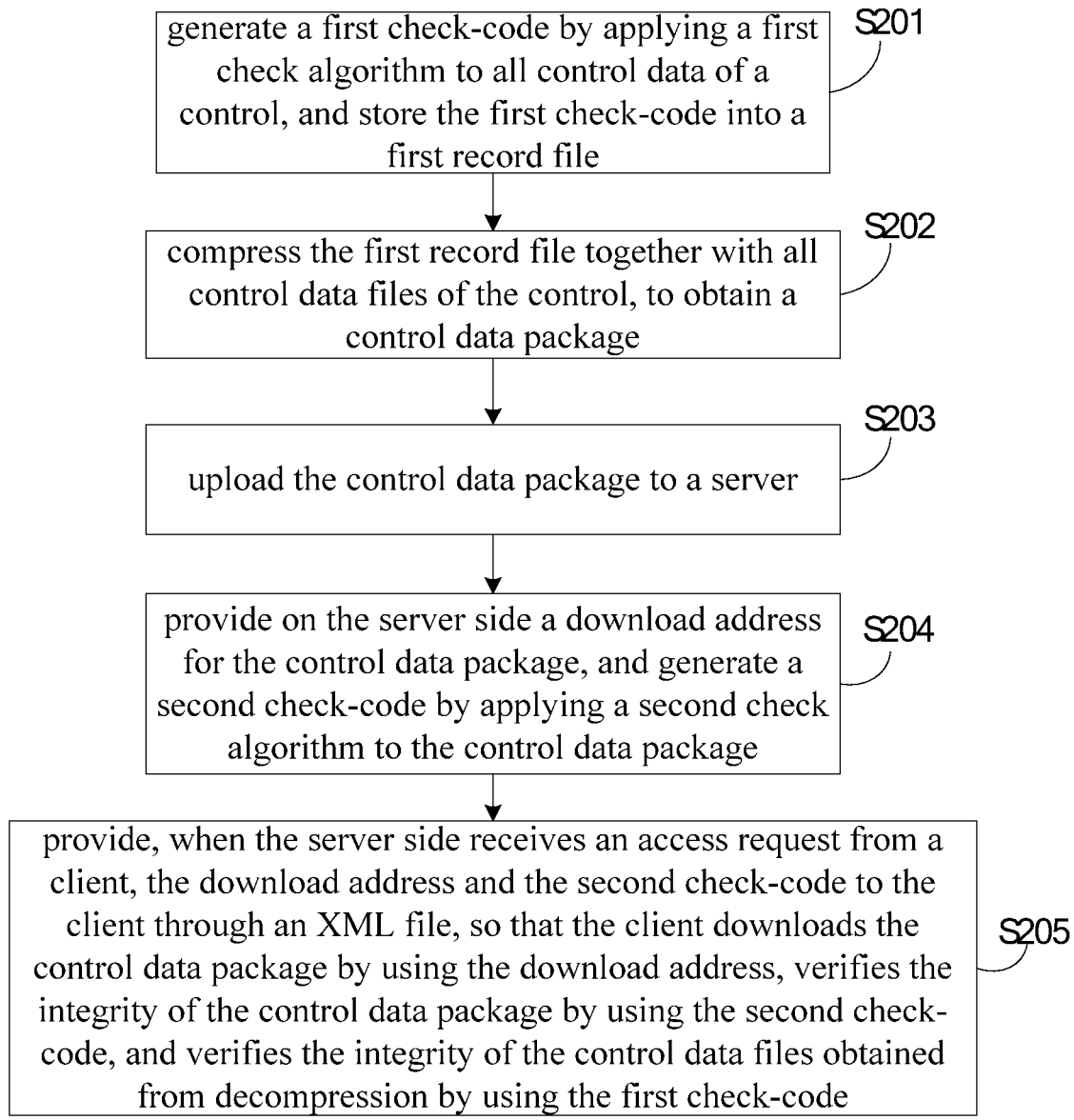
FIG. 2 is a flow chart of a processing method for transmitting data according to an embodiment of the present invention.

Corresponding to the processing device for transmitting data provided by the first or third embodiment of the invention, the fourth embodiment of the invention provides a processing method for transmitting data. As shown in FIG. 2, the method includes the following steps:

S201: generating a first check-code by applying a first check algorithm to all control data of a control, and storing the first check-code into a first record file;

S202: compressing the first record file together with all control data files of the control, to obtain a control data package;

S203: uploading the control data package to a server;

S204: providing on the server side a download address for the control data package, and generating a second check-code by applying a second check algorithm to the control data package; and S205: providing, when the server side receives an access request from a client, the download address and the second check-code to the client through an XML file, so that the client downloads the control data package by using the download address, verifies the integrity of the control data package by using the second check-code, and verifies the integrity of the control data files obtained from decompression by using the first check-code.

When the server side receives the access request from the client, the size of the control data package may be provided to the client through the XML file, so that the client verifies the integrity of the control data package by using the size of the control data package. Specifically, the client may determine whether the size of the downloaded control data package equals the control data package size analyzed from the XML file, and if not, perform error handling directly without verification by using the check code; if so, performing the third check-code generating step and subsequent steps, thus achieving two levels of verification.

In addition, when the server side receives the access request from the client, name and version information of the control may be provided to the client through an XML file, so that the client determines according to the name and version information whether to download the control data package. Specifically, before downloading the control data package, the client determines whether there exists the control locally and whether the version of it is the latest version released on the serve side, and if so, cancels the downloading of the control data package and subsequent operations.

In practice, the name and version information of the control data files of the control may be stored into a second record file; then the compression step specifically includes: compressing the first record file and the second record file together with the control data files, to obtain a control data package, so that in the case of updating a existing control, after correctly downloading and decompressing the control data package to the client, the client adds a new control data file into a local control data folder for the control or replaces an old-version control data file according to the name and version information of the control data files.

On the basis of the method above, the storage paths of the control data files on the client may also be stored into the second record file, so that the client stores the control data files obtained from decompression according to the storage paths.

In the method, multiple checks are performed on the data to achieve data integrity check; as a result, data status in each of the processes from data package downloading to decompression can be learned, which enables proper handling and avoids loading failures and execution failures caused by data incompleteness.

The method in the fourth embodiment corresponds to the processing device for transmitting data described in the first and third embodiments, the details of which are therefore omitted here.

It will be appreciated by those skilled in the art, all or some of the steps in the method of the embodiment can be implemented with a program instructing related hardware. The program may be stored in a computer-readable storage medium; when executed, the program performs the following steps: generating a first check-code by applying a first check algorithm to all control data of a control, and storing the first check-code into a first record file; compressing the first record file together with all control data files of the control, to obtain a control data package; uploading the control data package to a server; providing on the server side a download address for the control data package, and generating a second check-code by applying a second check algorithm to the control data package; and providing, when the server side receives an access request from a client, the download address and the second check-code to the client through an XML file, so that the client downloads the control data package by using the download address, verifies the integrity of the control data package by using the second check-code, and verifies the integrity of the control data files obtained from decompression by using the first check-code. The storage medium may be ROM/RAM, disk, CD-ROM, etc.

Fifth Embodiment

Figure 3:
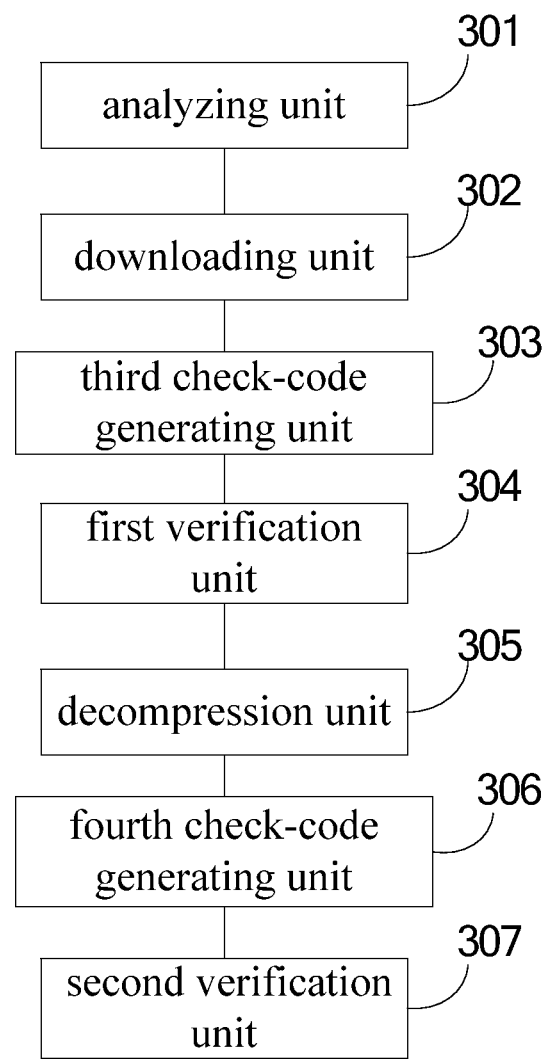
FIG. 3 is a schematic diagram illustrating a processing device for receiving data according to an embodiment of the present invention.

Corresponding to the processing device for transmitting data provided by the third embodiment, the fifth embodiment of the invention provides a processing device for receiving data for the processing of control data on the client side. As shown in FIG. 3, the device includes the following units:

an analyzing unit 301, adapted to analyze an XML file provided by a server, to acquire a download address for a control data package and a second check-code generated by the server side applying a second check algorithm to the control data package, with the control data package including a first record file and all control data files of a control, and the first record file storing a first check-code generated by applying a first check algorithm to all control data of the control;

a downloading unit 302, adapted to download the control data package from the server by using the download address;

a third check-code generating unit 303, adapted to generate a third check-code by applying the second check algorithm to the downloaded control data package;

a first verification unit 304, adapted to compare whether the third check-code is the same as the second check-code, so as to verify the integrity of the downloaded control data package;

a decompression unit 305, adapted to decompress, if the third check-code is the same as the second check-code, the downloaded control data package, to obtain the control data files of the control and the first record file;

a fourth check-code generating unit 306, adapted to generate a fourth check-code check by applying the first check algorithm to all the control data obtained from the decompression;

a second verification unit 307, adapted to compare whether the fourth check-code is the same as the first check-code, so as to verify the integrity of the control data files obtained from the decompression.

The analyzing unit 301 may further be adapted to acquire a control data package size provided by the server through the XML file.

Accordingly, the device may further include:

a third verification unit, adapted to compare whether the size of the downloaded control data package equals to the control data package size acquired from the XML file; and if so, trigger the third check-code generating unit to perform the third check-code generating step.

In practice, the analyzing unit 301 may further be adapted to acquire control name and version information provided by the server through an XML file.

Accordingly, the device may further include:

a determination unit, adapted to compare local control name and version information on the client with the control name and version information acquired from the XML file; and in the event where the control names are different or where the control names are the same but the version information are different, trigger the downloading unit to perform the downloading step.

In a preferred embodiment, the control data package may also include a second record file for storing name and version information of the control data files of the control. Accordingly, the device may further include:

a control data file processing unit, adapted to, if the fourth check-code is the same as the first check-code, add a new control data file into a local control data folder for the control on the client or replace an old-version data file according to the name and version information of the control data files.

or, the second record file may also be used for storing storage paths of the control data files on the client. Then the device may further include:

a control data file processing unit, adapted to store, if the fourth check-code is the same as the first check-code, the control data files obtained from decompression according to the storage paths.

Multiple checks are performed on the downloaded control data package and the control data obtained from decompression, to achieve data integrity check; as a result, data status in each of the processes from data package downloading to decompression can be learned, which enables proper handling and avoids loading failures and execution failures caused by data incompleteness.

Along with the processing device for transmitting data, corresponding processing on the client side has been described in the third embodiment of the invention, therefore specific implementations of the fifth embodiment can refer to those in the third embodiment, which are therefore omitted here.

Sixth Embodiment

Figure 4:
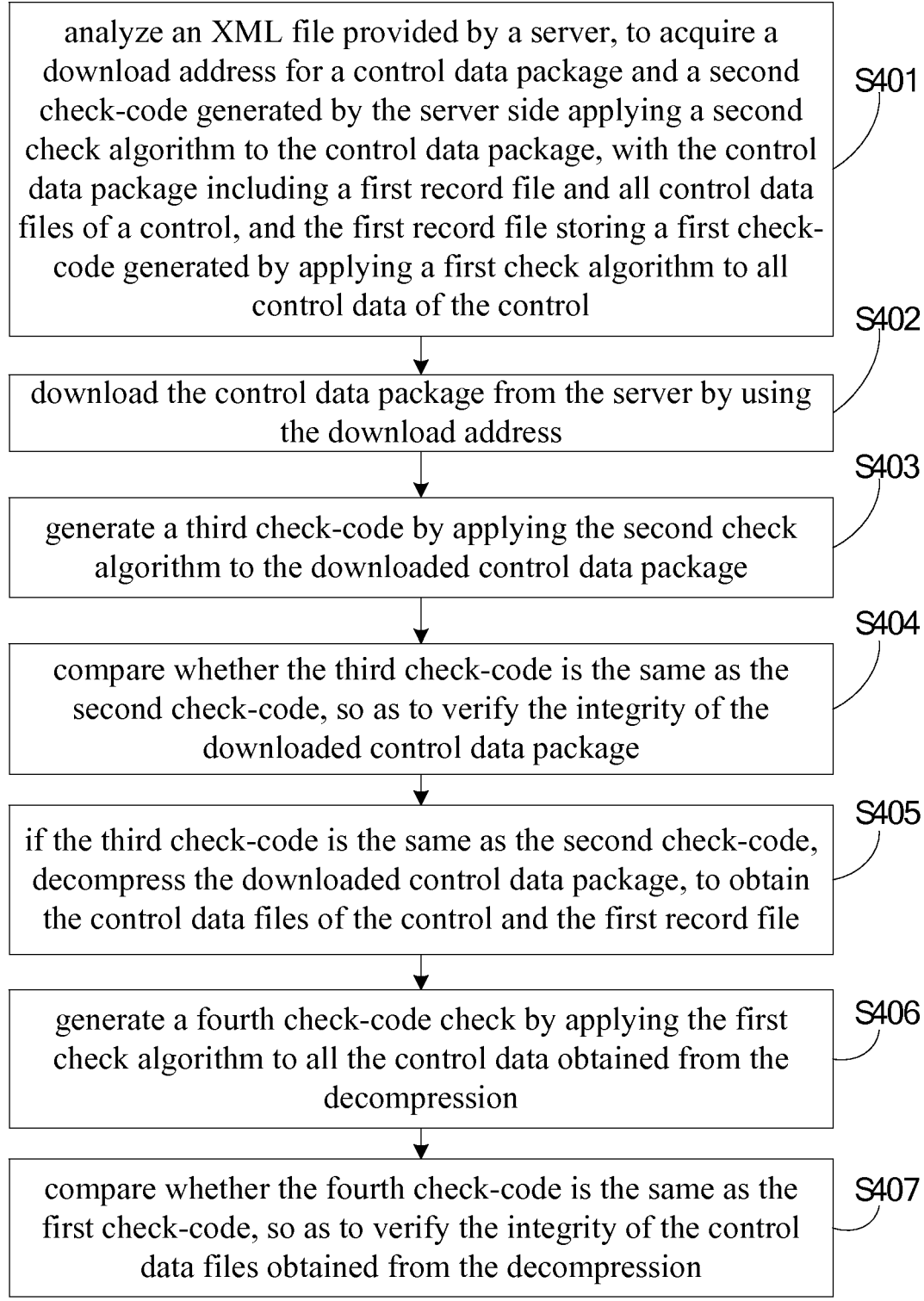
FIG. 4 is a flow chart of a processing method for receiving data according to an embodiment of the present invention.

Corresponding to the processing device for receiving data provided by the second and fifth embodiment of the invention, the sixth embodiment of the invention provides a processing method for receiving data. As shown in FIG. 4, the method includes the following steps:

S401: analyzing an XML file provided by a server, to acquire a download address for a control data package and a second check-code generated by the server side applying a second check algorithm to the control data package, with the control data package including a first record file and all control data files of a control, and the first record file storing a first check-code generated by applying a first check algorithm to all control data of the control;

S402: downloading the control data package from the server by using the download address;

S403: generating a third check-code by applying the second check algorithm to the downloaded control data package;

S404: comparing whether the third check-code is the same as the second check-code, so as to verify the integrity of the downloaded control data package, the same check algorithm applied to the same data will yield the same check-code, therefore, if the third check-code is the same as the second check-code, it is determined that the downloaded control data package is complete, i.e., its integrity is not compromised in the process of network transmission; on the contrary, if they are not the same, it is determined that the integrity of the downloaded control data package is compromised in the process of network transmission, then, error handling can be performed such as deleting the downloaded control data and promoting the error;

S405: if the third check-code is the same as the second check-code, decompressing the downloaded control data package, to obtain the control data files of the control and the first record file, that, only when the control data package is complete, the decompression step and subsequent steps are performed; on the contrary, when it is learned that the control data package is incomplete, the control data cannot work normally even if it can be decompressed, therefore, there is no need to perform the decompression operation.

S406: generating a fourth check-code check by applying the first check algorithm to all the control data obtained from the decompression;

S407: comparing whether the fourth check-code is the same as the first check-code, so as to verify the integrity of the control data files obtained from the decompression.

That is, a check algorithm that is the same as the one used before packaging is applied to the data of the control data files obtained from decompression. Similarly, the same check algorithm applied to the same data will yield the same check-code; therefore, by comparing the fourth check-code with the first check-code, the integrity of the data files obtained from decompression can be verified. That is, when the fourth check-code is the same as the first check-code, it is determined that the data file is complete, and its integrity is not compromised in process of decompression; otherwise, it is determined that the data file is damaged in the process of decompression, and corresponding error handling can be performed. It is noted, since it has been determined that the integrity of the control data package is not compromised in the process of downloading, i.e., the control data package obtained from downloading is complete, there is no need to re-download the control data package from the server, instead, re-decompression can be performed by the client, as well as subsequent steps.

A control data package size provided by the server through the XML file may also be acquired. And before generating the third check-code, the size of the downloaded control data package is compared with the control data package size obtained from the XML file, and only if they equal, the third check-code generating step is triggered. Therefore, two levels of verification are performed.

In practice, control name and version information provided on the server side through the XML file may be acquired by the client. Before performing the downloading step, the control name and version information of a local control of the client is compared with the control name and version information obtained from the XML file, and in the event where the control names are different or where the control names are the same but the version information are different, the downloading step is triggered, to avoid unnecessary downloading operations.

In addition, the control data package may also include a second record file for storing name and version information of the control data files of the control, then the method may further include the following steps:

if the fourth check-code is the same as the first check-code, adding a new control data file into a local control data folder for the control on the client or replacing an old-version data file according to the name and version information of the control data files.

The second record file may also be used for storing storage paths of the control data files on the client; the method may further include the following steps:

if the fourth check-code is the same as the first check-code, storing the control data files obtained from decompression according to the storage paths.

Multiple checks are performed on the downloaded control data package and the control data obtained from decompression, to achieve data integrity check; as a result, data status in each of the processes from data package downloading to decompression can be learned, which enables proper handling and avoids loading failures and execution failures caused by data incompleteness.

Along with the processing device for transmitting data, corresponding processing on the client side has been described in the third embodiment of the invention, therefore specific implementations of the sixth embodiment can refer to those in the third embodiment, which are therefore omitted here.

It will be appreciated by those skilled in the art, all or some of the steps in the method of the embodiment can be implemented with a program instructing related hardware. The program may be stored in a computer-readable storage medium; when executed, the program performs the following steps: analyzing an XML file provided by a server, to acquire a download address for a control data package and a second check-code generated by the server side applying a second check algorithm to the control data package, with the control data package including a first record file and all control data files of a control, and the first record file storing a first check-code generated by applying a first check algorithm to all control data of the control; downloading the control data package from the server by using the download address; generating a third check-code by applying the second check algorithm to the downloaded control data package; comparing whether the third check-code is the same as the second check-code, so as to verify the integrity of the downloaded control data package; if the third check-code is the same as the second check-code, decompressing the downloaded control data package, to obtain the control data files of the control and the first record file; generating a fourth check-code check by applying the first check algorithm to all the control data obtained from the decompression; and comparing whether the fourth check-code is the same as the first check-code, so as to verify the integrity of the control data files obtained from the decompression. The storage medium may be ROM/RAM, disk, CD-ROM, etc.

The processing devices for transmitting and received data and methods thereof provided by the embodiments of the present invention are described above in detail. Specific examples are given in the description of the general principle and implementations of the present invention; however, the specific embodiments disclosed herein are for illustrative purposes only. Those skilled in the art can make modifications to the embodiments and applications herein without deviation from the scope of the present invention. Therefore, the disclosure herein shall not be considered as limiting the present invention.

The invention claimed is:

1. A processing device for transmitting data, comprising:
at least one processor;
a first check-code generating unit, adapted to generate, by the at least one processor, a first check-code by applying a first check algorithm to all control data of a control, and store the first check-code into a first record file;
a compression unit, adapted to compress the first record file together with all control data files of the control, to obtain a control data package;
an uploading unit, adapted to upload the control data package to a server;
a second check-code generating unit, adapted to provide on the server a download address for the control data package, and generate a second check-code by applying a second check algorithm to the control data package; and
an information providing unit, adapted to provide, when the server receives an access request from a client, the download address and the second check-code to the client through an XML file, so the client downloads the control data package by using the download address, verifies integrity of the control data package by using the second check-code, and verifies integrity of the control data files obtained from decompression by using the first check-code.

2. The device according to claim 1, wherein,
the information providing unit is further adapted to provide, when the server receives the access request from the client, the size of the control data package to the client through the XML file, so the client verifies the integrity of the control data package by using the size of the control data package.

3. The device according to claim 1, wherein,
the information providing unit is further adapted to provide, when the server receives the access request from the client, name and version information of the control to the client through an XML file, so the client determines according to the name and version information whether to download the control data package.

4. The device according to claim 1, wherein the device further comprises:
a file name and version information storing unit, adapted to store name and version information of the control data files of the control into a second record file,
and wherein the compression unit is adapted to compress the first record file and the second record file together with the control data files, to obtain a control data package, so after correctly downloading and decompressing the control data package to the client, the client adds a new control data file into a local control data folder for the control or replaces an old-version control data file according to the name and version information of the control data files.

5. The device according to claim 4, further comprising:
a storage path information storing unit, adapted to store storage paths of the control data files on the client into the second record file, so the client stores the control data files obtained from decompression according to the storage paths.

6. A processing method for transmitting data, comprising:
generating a first check-code by applying a first check algorithm to all control data of a control, and storing the first check-code into a first record file;
compressing the first record file together with all control data files of the control, to obtain a control data package;
uploading the control data package to a server;
providing on the server a download address for the control data package, and generating a second check-code by applying a second check algorithm to the control data package; and
providing, when the server receives an access request from a client, the download address and the second check-code to the client through an XML file, so the client downloads the control data package by using the download address, verifies integrity of the control data package by using the second check-code, and verifies integrity of the control data files obtained from decompression by using the first check-code.

7. The method according to claim 6, further comprising:
when the server receives the access request from the client, providing the size of the control data package to the client through the XML file, so the client verifies the integrity of the control data package by using the size of the control data package.

8. The method according to claim 6, further comprising:
when the server receives the access request from the client, providing name and version information of the control to the client through an XML file, so the client determines according to the name and version information whether to download the control data package.

9. The method according to claim 6, wherein the method further comprises:
storing name and version information of the control data files of the control into a second record file,
and wherein the compressing step comprises:
compressing the first record file and the second record file together with the control data files, to obtain a control data package, so after correctly downloading and decompressing the control data package to the client, the client adds a new control data file into a local control data folder for the control or replaces an old-version control data file according to the name and version information of the control data files.

10. The method according to claim 9, further comprising:
storing storage paths of the control data files on the client into the second record file, so the client stores the control data files obtained from decompression according to the storage paths.

11. A processing device for receiving data, comprising:
at least one processor;
an analyzing unit, adapted to analyze an XML file provided by a server, to acquire a download address for a control data package and a second check-code generated by the server applying a second check algorithm to the control data package, with the control data package comprising a first record file and all control data files of a control, and the first record file storing a first check-code generated by applying a first check algorithm to all control data of the control;
a downloading unit, adapted to download the control data package from the server by using the download address;
a third check-code generating unit, adapted to generate a third check-code by applying the second check algorithm to the downloaded control data package;
a first verification unit, adapted to compare whether the third check-code is the same as the second check-code, so as to verify integrity of the downloaded control data package;
a decompression unit, adapted to decompress, if the third check-code is the same as the second check-code, the downloaded control data package, to obtain the control data files of the control and the first record file;
a fourth check-code generating unit, adapted to generate, by the at least one processor, a fourth check-code check by applying the first check algorithm to all the control data obtained from the decompression; and
a second verification unit, adapted to compare whether the fourth check-code is the same as the first check-code, so as to verify integrity of the control data files obtained from the decompression.

12. The device according to claim 11, wherein,
the analyzing unit is further adapted to acquire a control data package size provided by the server through the XML file;
and the device further comprises:
a third verification unit, adapted to compare whether the size of the downloaded control data package equals to the control data package size acquired from the XML file; and if so, trigger the third check-code generating unit to perform the third check-code generating step.

13. The device according to claim 11, wherein,
the analyzing unit is further adapted to acquire control name and version information provided by the server through an XML file;
and the device further comprises:
a determination unit, adapted to compare local control name and version information on the client with the control name and version information acquired from the XML file; and in the event where the control names are different or where the control names are the same but the version information are different, trigger the downloading unit to perform the downloading step.

14. The device according to claim 11, wherein, the control data package also comprises a second record file for storing name and version information of the control data files of the control, and the device further comprises:
a control data file processing unit, adapted to, if the fourth check-code is the same as the first check-code, add a new control data file into a local control data folder for the control on the client or replace an old-version data file according to the name and version information of the control data file.

15. The device according to claim 14, wherein, the second record file is also used for storing storage paths of the control data files on the client, and the device further comprises:
a control data file processing unit, adapted to store, if the fourth check-code is the same as the first check-code, the control data files obtained from decompression according to the storage paths.

16. A processing method for receiving data, comprising:
analyzing an XML file provided by a server, to acquire a download address for a control data package and a second check-code generated by the server applying a second check algorithm to the control data package, with the control data package comprising a first record file and all control data files of a control, and the first record file storing a first check-code generated by applying a first check algorithm to all control data of the control;
downloading the control data package from the server by using the download address;
generating a third check-code by applying the second check algorithm to the downloaded control data package;
comparing whether the third check-code is the same as the second check-code, so as to verify integrity of the downloaded control data package;
if the third check-code is the same as the second check-code, decompressing the downloaded control data package, to obtain the control data files of the control and the first record file;
generating a fourth check-code check by applying the first check algorithm to all the control data obtained from the decompression; and
comparing whether the fourth check-code is the same as the first check-code, so as to verify integrity of the control data files obtained from the decompression.

17. The method according to claim 16, further comprising:
acquiring a control data package size provided by the server through the XML file;
comparing whether the size of the downloaded control data package equals to the control data package size acquired from the XML file; and if so, triggering the third check-code generating step.

18. The method according to claim 16, further comprising:
acquiring control name and version information provided by the server through an XML file;
comparing local control name and version information on the client with the control name and version information acquired from the XML file; and in the event where the control names are different or where the control names are the same but the version information are different, triggering the downloading step.

19. The method according to claim 16, wherein, the control data package also comprises a second record file for storing name and version information of the control data files of the control, the method further comprises:
if the fourth check-code is the same as the first check-code, adding a new control data file into a local control data folder for the control on the client or replacing an old-version data file according to the name and version information of the control data file.

20. The method according to claim 19, wherein, the second record file is also used for storing storage paths of the control data files on the client, and the method further comprises:
if the fourth check-code is the same as the first check-code, storing the control data files obtained from decompression according to the storage paths.

* * * * *